(12) United States Patent
Zhang et al.

(10) Patent No.: US 11,310,927 B2
(45) Date of Patent: *Apr. 19, 2022

(54) LED DISPLAY SCREEN

(71) Applicant: SHENZHEN GLOSHINE TECHNOLOGY CO., LTD., Guangdong (CN)

(72) Inventors: Xianfeng Zhang, Guangdong (CN); Yongjun Zhang, Guangdong (CN); Guoqiang Li, Guangdong (CN); Yongfeng Guo, Guangdong (CN)

(73) Assignee: SHENZHEN GLOSHINE TECHNOLOGY CO., LTD., Shenzhen (CN)

(*) Notice: Subject to any disclaimer, the term of this patent is extended or adjusted under 35 U.S.C. 154(b) by 0 days.

This patent is subject to a terminal disclaimer.

(21) Appl. No.: 17/257,340

(22) PCT Filed: Nov. 23, 2018

(86) PCT No.: PCT/CN2018/117254
§ 371 (c)(1),
(2) Date: Dec. 31, 2020

(87) PCT Pub. No.: WO2020/103144
PCT Pub. Date: May 28, 2020

(65) Prior Publication Data
US 2021/0274661 A1    Sep. 2, 2021

(51) Int. Cl.
*G09F 9/30*     (2006.01)
*H05K 5/00*     (2006.01)
*H05K 5/02*     (2006.01)

(52) U.S. Cl.
CPC ......... *H05K 5/0017* (2013.01); *H05K 5/0221* (2013.01); *H05K 5/0247* (2013.01)

(58) Field of Classification Search
None
See application file for complete search history.

(56) References Cited

U.S. PATENT DOCUMENTS 6,266,123 B1 * 7/2001 Maejima ............... G02F 1/1333
                                                349/158
6,729,054 B1 * 5/2004 VanderTuin .......... G09F 9/3026
                                                 16/236

(Continued)

FOREIGN PATENT DOCUMENTS

CN    102829305 A    12/2012
CN    203338684 U    12/2013
(Continued)

OTHER PUBLICATIONS

Search report of counterpart European Patent Application No. 18940784.4 dated Nov. 11, 2021.

(Continued)

*Primary Examiner* — Xanthia C Cunningham

(57) ABSTRACT

Provided is an LED display screen, comprising an LED display unit, a box frame arranged at two outer ends of the unit, a power control box fixedly connected to the unit and a curved surface adjustment device. The unit includes a front body, a rear body, a bendable flexible lamp panel and an elastic stop piece; The front body covers one side of the lamp panel provided with LED lamps, and the rear body includes a plurality of rear body units, each is fixedly connected to one side of the lamp panel facing away from the LED lamps, and adjacent rear body units are arranged at intervals; The elastic stop piece is positioned between the lamp panel and rear body; one end of the curved surface adjustment device is fixedly connected to the box frame and another end is fixedly connected to the power control box.

15 Claims, 14 Drawing Sheets

(56) References Cited

U.S. PATENT DOCUMENTS

| | | | |
|---|---|---|---|
| 8,384,616 B2* | 2/2013 | Elliott | F21K 9/20 345/82 |
| 9,119,298 B2 | 8/2015 | Park | |
| 9,560,751 B2 | 1/2017 | Huitema et al. | |
| 9,576,510 B2 | 2/2017 | Ren et al. | |
| 9,671,530 B2* | 6/2017 | Kwon | G02F 1/133608 |
| 9,843,758 B2* | 12/2017 | Park | G09G 3/20 |
| 10,113,685 B2* | 10/2018 | Cho | F16M 11/08 |
| 10,383,218 B2* | 8/2019 | Lee | G02F 1/133308 |
| 10,440,838 B2* | 10/2019 | Heo | G06F 3/1446 |
| 10,626,961 B2* | 4/2020 | Heo | G09F 9/33 |
| 10,767,808 B2* | 9/2020 | Li | F16M 11/18 |
| 10,881,010 B2* | 12/2020 | Kim | H05K 5/0017 |
| 11,016,319 B2* | 5/2021 | Iemura | G02F 1/133308 |
| 11,122,695 B2* | 9/2021 | Yi | H05K 5/03 |
| 11,145,635 B2* | 10/2021 | Zhang | G09F 9/33 |
| 11,175,535 B2* | 11/2021 | Qu | G02F 1/133606 |
| 11,217,122 B2* | 1/2022 | Sagidullin | G09F 13/02 |
| 11,229,127 B2* | 1/2022 | Hwang | G06F 1/1652 |
| 2006/0152933 A1* | 7/2006 | Kramer | F21V 23/04 362/382 |
| 2008/0018631 A1* | 1/2008 | Hioki | G02F 1/133526 345/206 |
| 2013/0155655 A1* | 6/2013 | Lee | G02F 1/133 361/752 |
| 2015/0043136 A1 | 2/2015 | Kim et al. | |
| 2017/0105293 A1* | 4/2017 | Kim | H05K 5/0221 |
| 2017/0303408 A1* | 10/2017 | Lee | H05K 5/0021 |
| 2018/0039471 A1* | 2/2018 | Yanagisawa | H01L 27/3267 |
| 2021/0410300 A1* | 12/2021 | Zhang | H05K 5/0217 |

FOREIGN PATENT DOCUMENTS

| | | |
|---|---|---|
| CN | 104008707 A | 8/2014 |
| CN | 108447412 A | 8/2018 |

OTHER PUBLICATIONS

International Search Report of PCT Patent Application No. PCT/CN2018/117254 dated Aug. 21, 2019.

* cited by examiner

LED DISPLAY SCREEN

TECHNICAL FIELD

The disclosure relates to the technical field of LED display screens, in particular to an LED display screen.

BACKGROUND

With the development of science and technology, LED display screen has the advantages of high brightness, low working voltage, low power consumption, large size, long life, impact resistance and stable performance, and is widely used in people's lives and production. The development prospect of LED display screen is very broad, and it is developing towards higher brightness, higher weather resistance, higher luminous density, higher luminance uniformity, reliability and full color. LED display screen is widely used in advertising and publicity in different outdoor places such as stadiums, commercial applications, banks, securities, postal services, docks, shopping malls, stations, telecommunications, institutions, monitoring, schools, restaurants, hotels, entertainments, etc.

At present, another development trend of LED display is Large Screen Display, such as outdoor advertising or large-scale scene display, floor tile screen or large screen game interfaces. Large screen displays or super-large screens are usually composed of a plurality of display devices spliced by light boxes. For LED large-screen displays, the whole screen is spliced by several LED boxes, which is realized with the assistance of traction and hoisting equipment. After splicing, workers need to stand behind the screen for complex wiring, power connection and line connection. The whole process is complicated and very prone to errors.

For the current spliced LED large screen displays, attention is usually paid to seamless splicing, and the convenience and stability of installation. Therefore, the existing spliced LED large screen displays are basically flat, with few curved large screens. A few existing large curved screens achieve curved surface effect by setting the splicing angle of multiple planes of LED light boxes. However, this curved surface effect is not a curved surface in the true sense, and its LED light boxes still adopt the traditional box structure, which does not fundamentally achieve curved surface design.

Technical Problem

Aiming to solve the technical problem that the existing LED display adopts the traditional box structure and does not fundamentally achieve the curved surface design, the application provides an LED display screen.

Technical Solutions

The technical solutions for the above problem are as followings: An LED display screen, comprising an LED display unit, a box frame arranged at two outer ends of the LED display unit and a power control box fixedly connected to the LED display unit. The LED display unit is characterized by comprising a front body, a rear body, a bendable flexible lamp panel and an elastic stop piece for limiting the ultimate bending degree of the lamp panel; the front body covers one side of the lamp panel provided with LED lamps, and the rear body comprises a plurality of rear body units, each rear body unit is fixedly connected to one side of the lamp panel facing away from the LED lamps, and adjacent rear body units are arranged at intervals; the elastic stop piece is positioned between the lamp panel and the rear body;

the LED display screen further comprises a curved surface adjustment device for adjusting the curved shape of the LED display unit, wherein one end of the curved surface adjustment device is fixedly connected to the box frame and another end is fixedly connected to the power control box.

In the LED display screen of the disclosure, a positioning column is arranged on one side of the lamp panel away from the LED lamps, and a positioning hole is correspondingly arranged on the rear body unit; a connection screw passes through the positioning hole and matches with a first threaded hole of the positioning column to fixedly connect the lamp panel and the rear body.

In the LED display screen of the disclosure, the positioning column is a cylinder, and one end close to the lamp panel is a front end, another end is a rear end; the front end has a larger diameter than the rear end;

the elastic stop piece is provided with a plurality of first through holes corresponding to the rear end, and the elastic stop piece is sleeved on the rear end through the first through holes; and when the LED display unit is bent, the positioning column slides along the first through hole.

In the LED display screen of the disclosure, the elastic stop piece is provided with a second through hole, and a stop block of the rear body is inserted into the second through hole; when the LED display unit is bent, the stop block slides along the second through hole, and when the stop block abuts against an end of the second through hole in the sliding direction of the positioning column, either the positioning column abuts against an end of the first through hole in the sliding direction of the positioning column or the positioning column does not abut against an end of the first through hole in the sliding direction of the positioning column.

In the LED display screen of the disclosure, the plurality of rear body units are divided into a rear body unit B, a rear body unit A for connecting with the box frame and a rear body unit C for fixedly connecting with the power control box, the rear body unit C is positioned in the middle of the rear body, and the rear body unit B is positioned between the rear body unit A and the rear body unit C;

the rear body unit C is provided with a third through hole, the lamp panel is correspondingly provided with a connector for connecting the power control box, and the connector is inserted into the third through hole.

In the LED display screen of the disclosure, the curved surface adjustment device comprises an angle rotating assembly and a locking assembly, and the angle rotating assembly comprises a middle plate and a shell, the shell comprises a first mounting part and a containing part, and an arc chute is formed inside the containing part, the middle plate comprises a second mounting part and an arc sliding part, the second mounting part is positioned outside the arc chute, the arc sliding part is positioned inside the arc chute, the first mounting part and the second mounting part are positioned at both sides of the arc chute; the first mounting part is fixedly connected to the box frame, and the second mounting part is fixedly connected to the power control box;

the locking assembly comprises a locking mechanism, and the locking mechanism has a locking state and an unlocking state, when the locking mechanism is in the locking state, the arc sliding part is locked in the arc chute, when the locking mechanism is in the unlocking state, the arc sliding part can slide relative to the arc chute to adjust the included angle between the first mounting part and the second mounting part.

In the LED display screen of the disclosure, the containing part comprises a cover plate and a bottom plate, the arc chute is arranged on the bottom plate, and the cover plate is fixedly connected to the bottom plate and covers the arc chute.

In the LED display screen of the disclosure, the locking mechanism comprises a threaded piece, a butt-up bar, a shaft sleeve and a locking piece, and the shaft sleeve is fixedly connected to the bottom plate; a fourth through hole extending along the axial direction of the shaft sleeve is arranged on the shaft sleeve, a locking hole axially passing through the fourth through hole is arranged on the bottom plate, and the locking piece is positioned in the locking hole;

the butt-up bar is slidably connected in the fourth through hole, one end of the butt-up bar is provided with a second threaded hole, one end of the threaded piece is threadedly connected in the second threaded hole, another end of the butt-up bar abuts against the locking piece, and rotating the threaded piece can make the butt-up bar slide along the fourth through hole, so that the locking piece locks the arc sliding part.

In the LED display screen of the disclosure, the locking piece comprises a locking plate and a locking shaft fixed on the locking plate, and a positioning pin is arranged on the locking shaft, the middle plate is provided with a plurality of locking slots for limiting the positioning pin, and rotating the threaded piece can lock the positioning pin in the corresponding locking slots.

In the LED display screen of the disclosure, the locking mechanism further comprises a spring, the spring is sleeved on the locking shaft and supported between the locking plate and the bottom plate.

In the LED display screen of the disclosure, the threaded piece comprises a threaded part, a fixed part and a stop collar located between the threaded part and the fixed part, and the threaded part is threadedly connected in the second threaded hole;

an annular rotation slot is formed on the periphery of the stop collar, and the locking mechanism further comprises a detent, the detent passes through the shaft sleeve and is clamped into the rotation slot;

the locking assembly further comprises a rotating rod, one end of the rotating rod is fixedly connected with the fixed part, and the threaded piece can be rotated by rotating the rotating rod.

In the LED display screen of the disclosure, the locking assembly further comprises a rotation stop ring, the rotation stop ring is sleeved on the shaft sleeve, a rotation stop slot is arranged on an inner side wall of the rotation stop ring, and a rotation stop hole is arranged at one end of the rotation stop ring;

a first rotation stop block is arranged on the shaft sleeve, the first rotation stop block is slidably connected in the rotation stop slot, and a second rotation stop block is arranged at one end of the rotating rod corresponding to the position of the rotation stop hole;

the rotation stop ring is provided with a rotation stop position and a rotation position, and at the rotation stop position of the rotation stop ring, the second rotation stop block is located in the rotation stop hole; at the rotation position of the rotation stop ring, the second rotation stop block is away from the rotation stop hole.

In the LED display screen of the disclosure, the curved surface adjustment device comprises two angle rotating assemblies, and the locking assembly comprises two locking mechanisms, the two angle rotating assemblies are symmetrically arranged at two ends of the rotating rod, the two locking mechanisms are symmetrically connected at two ends of the rotating rod and are respectively positioned between the angle rotating assembly and the rotating rod; rotating the rotating rod can make the two locking mechanisms switch between the locking state and the unlocking state synchronously.

In the LED display screen of the disclosure, a guide arc hole is arranged on the middle plate, a guide column is arranged on the bottom plate, radians of the guide arc hole and the arc chute are the same and their centers coincide, and the guide column is positioned in the guide arc hole.

In the LED display screen of the disclosure, the LED display screen comprises two sets of the curved surface adjustment devices, the box frame comprises a left frame and a right frame, the first mounting part of one set of the curved surface adjustment device is fixedly connected to the left frame, and the second mounting part is fixedly connected to the power control box; the first mounting part of another set of the curved surface adjustment device is fixedly connected to the right frame, and the second mounting part is fixedly connected to the power control box.

Beneficial Effects

Compared with the prior art, the LED display screen provided by disclosure adopts a bendable flexible lamp panel, the LED display unit can be adjusted to be a curved surface by a curved surface adjustment device, and the shape of the curved surface can be freely adjusted, so that the curved surfaces formed by multiple LED display screens are fit together, the screens even can be assembled into abnormity bent surface; And the elastic stop piece limits the ultimate bending degree of the LED display unit, thereby avoiding the LED display unit from being damaged due to excessive bending and prolonging the service life of the LED display unit; Furthermore, there are gaps among the rear body units, which are beneficial to release the bending stress and avoid the fracture of the rear body during bending.

Figure 1:
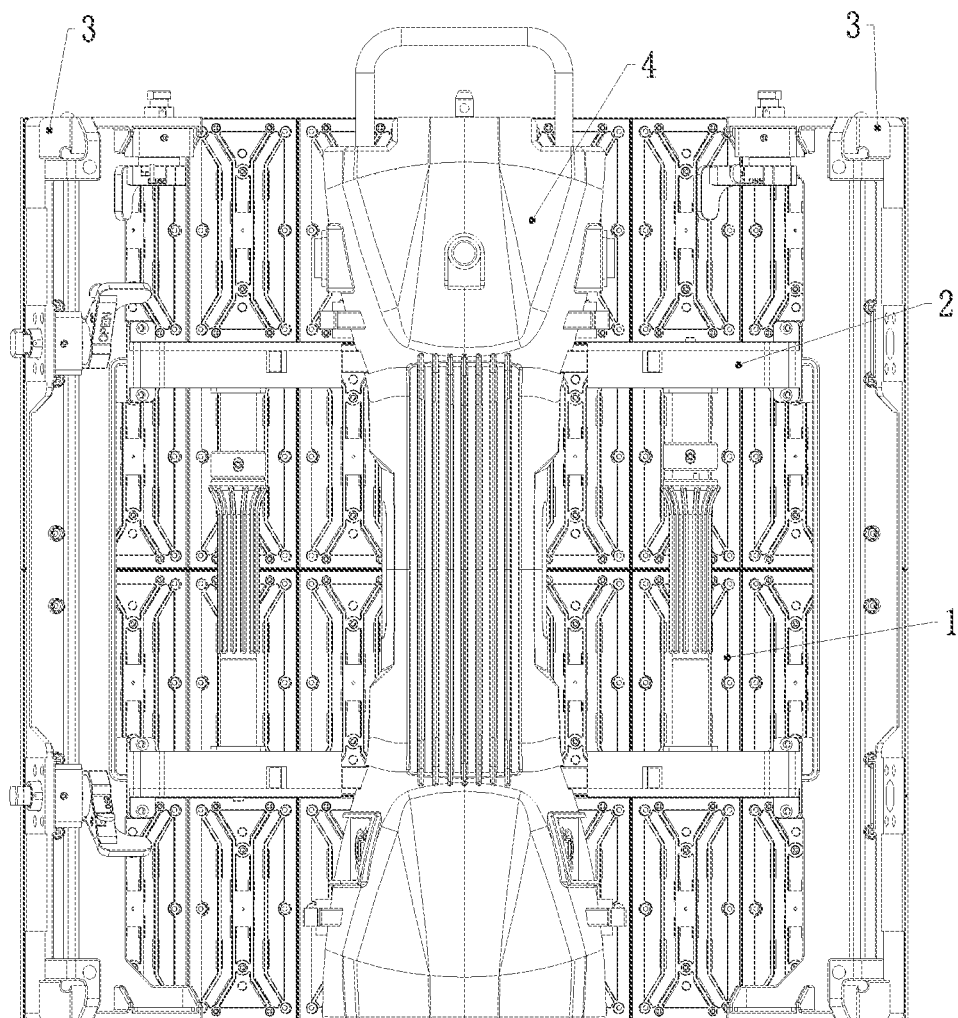
FIG. 1 is a structural schematic diagram of the LED display screen provided by an embodiment of the present disclosure.

In the figures:
1. LED display unit;
11. Front body;
12. Lamp panel;
121. Positioning column; 1211. First threaded hole; 1212. Front end; 1213. Rear end;
122. Connector;
13. Rear body;
131. Rear body unit;
131a. Rear body unit A; 131b. Rear body unit B; 131c. Rear body unit C;
1311. Positioning hole; 1312. Third through hole;
132. Stop block;
14. Elastic stop piece; 141. First through hole; 142. Second through hole;
15. Connection screw;
2. Curved surface adjustment device;
21. Angle rotating assembly;
211. Middle plate;
2111. Second mounting part; 2112. Arc sliding part; 2113. Locking slot; 2114. Angle label; 2115. Marble slot; 2116. Guide arc hole;
212. Shell; 2121. First mounting part; 2122. Cover plate; 2123. Bottom plate; 21231. Arc chute; 21232. Locking hole; 21233. Label hole;
21234. Guide column; 21235. Marble screw;
22. Locking mechanism;
221. Threaded piece; 2211. Threaded part; 2212. Fixed part;
2213. Stop collar; 22131. Rotation slot;
222. Butt-up bar; 2221. Second threaded hole;
223. Shaft sleeve; 2231. Fourth through hole; 2232. First rotation stop block;
224. Locking piece; 2241. Locking plate; 2242. Locking shaft; 2243. Positioning pin;
225. Spring; 226. Detent;
23. Rotating rod; 231. Second rotation stop block; 232. Clamping hole;
24. Rotation stop ring; 241. Rotation stop slot;
3. Box frame;
4. Power control box.

DETAILED DESCRIPTION OF DISCLOSED EMBODIMENTS

In order to make the technical problem to be solved, technical solutions and beneficial effects of the present closure clearer, the disclosure will be further described in detail with reference to the drawings and embodiments. It should be understood that the preferred embodiments described below are merely used to illustrate and explain the present disclosure, and not intended to limit the present disclosure.

As shown in FIG. 1 to FIG. 4, an LED display screen provided by an embodiment of the present disclosure includes an LED display unit 1, a box frame 3 arranged at two outer ends of the LED display unit 1 and a power control box 4 fixedly connected to the LED display unit 1. The LED display unit 1 includes a front body 11, a rear body 13, a bendable flexible lamp panel 12 and an elastic stop piece 14 for limiting the ultimate bending degree of the lamp panel 12; the front body 11 covers one side of the lamp panel 12 provided with LED lamps, and the rear body 13 comprises a plurality of rear body units 131, each rear body unit 131 is fixedly connected to one side of the lamp panel 12 facing away from the LED lamps, and adjacent rear body units 131 are arranged at intervals; the elastic stop piece 14 is positioned between the lamp panel 12 and the rear body 13;

the LED display screen further comprises a curved surface adjustment device 2 for adjusting the curved shape of the LED display unit 1, one end of the curved surface adjustment device 2 is fixedly connected to the box frame 3 and another end is fixedly connected to the power control box 4.

In the present disclosure, a bendable flexible lamp panel is adopted, the LED display unit can be adjusted to be a curved surface by a curved surface adjustment device 2, and the shape of the curved surface can be freely adjusted, so that the curved surfaces formed by multiple LED display screens are fit together, the screens even can be assembled into abnormity bent surface; And the elastic stop piece 14 limits the ultimate bending degree of the LED display unit 1, thereby avoiding the LED display unit 1 from being damaged due to excessive bending and prolonging the service life of the LED display unit 1; Furthermore, there are gaps among the rear body units 131, which are beneficial to release the bending stress and avoid the fracture of the rear body 13 during bending.

Specifically, the lamp panel 12 includes a PCB board, LED lamps and electronic components, wherein the LED lamps are positioned on one side of the PCB board, and the electronic components are welded on the side of the PCB board away from the LED lamps.

Specifically, the front body 11 is a net cover, which can protect LED lamps and prolong the service life of the lamp panel 12.

Specifically, the elastic stop piece 14 is a long elastic strip. It is material-saving, and the ultimate bending degree of LED display unit 1 can be increased, thus more various curved surfaces can be realized.

Specifically, the rear body units 131 are distributed on the elastic stop piece 14 at equal intervals, so that the stress is uniform everywhere, and the service life of LED display unit 1 is prolonged.

In an embodiment, a positioning column 121 is arranged on one side of the lamp panel 12 away from the LED lamps, and a positioning hole 1311 is correspondingly arranged on the rear body 13 unit. And fastener, the positioning hole 1311 and the positioning column 121 are matched to fixedly connect the lamp panel 12 and the rear body 13. Therefore, the connection is firmer and more stable, pieces are not easy to fall off, and it is convenient for disassembly and maintenance.

Figure 4:
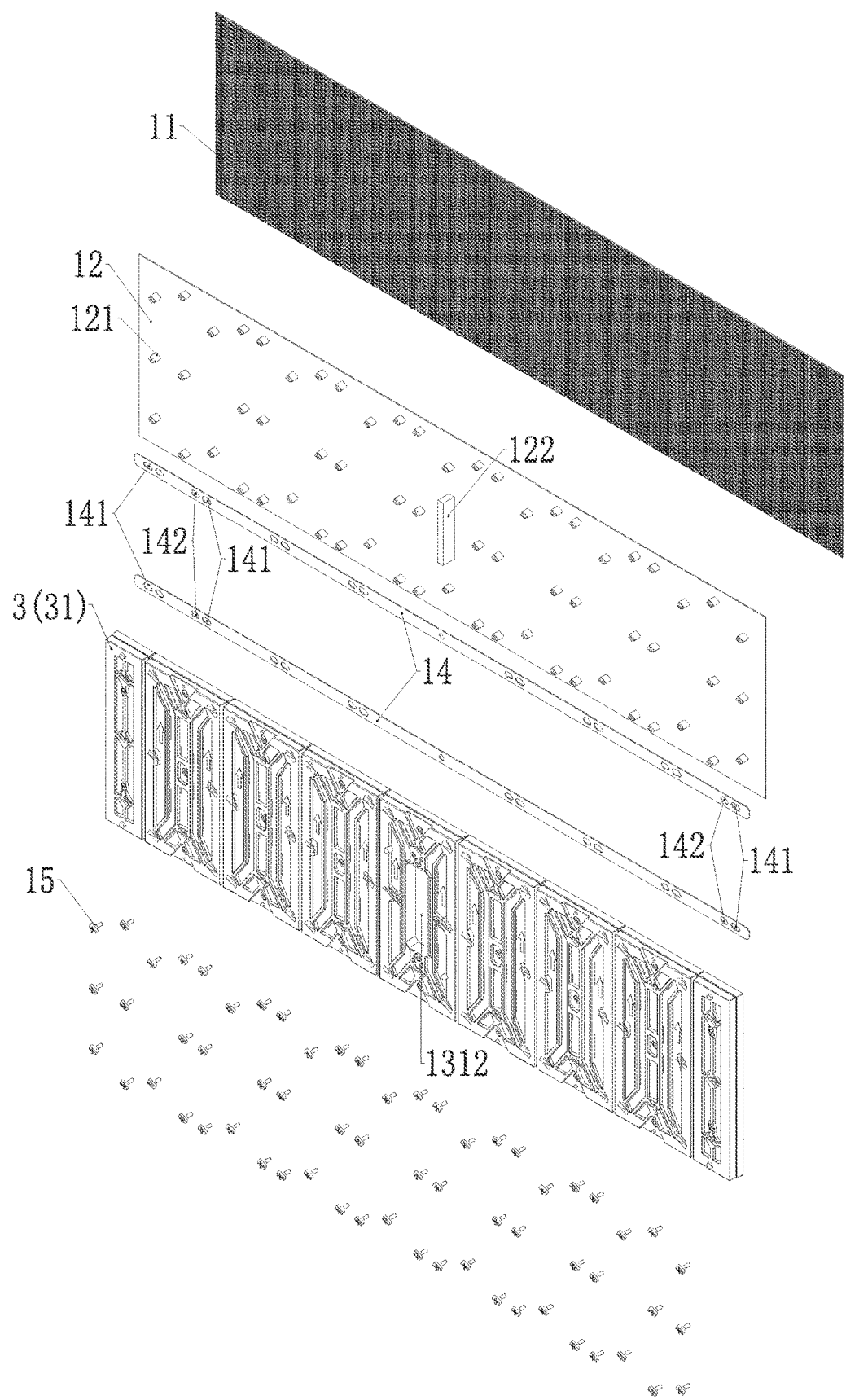
FIG. 4 is an exploded view of the structure in FIG. 3.
Figure 5:
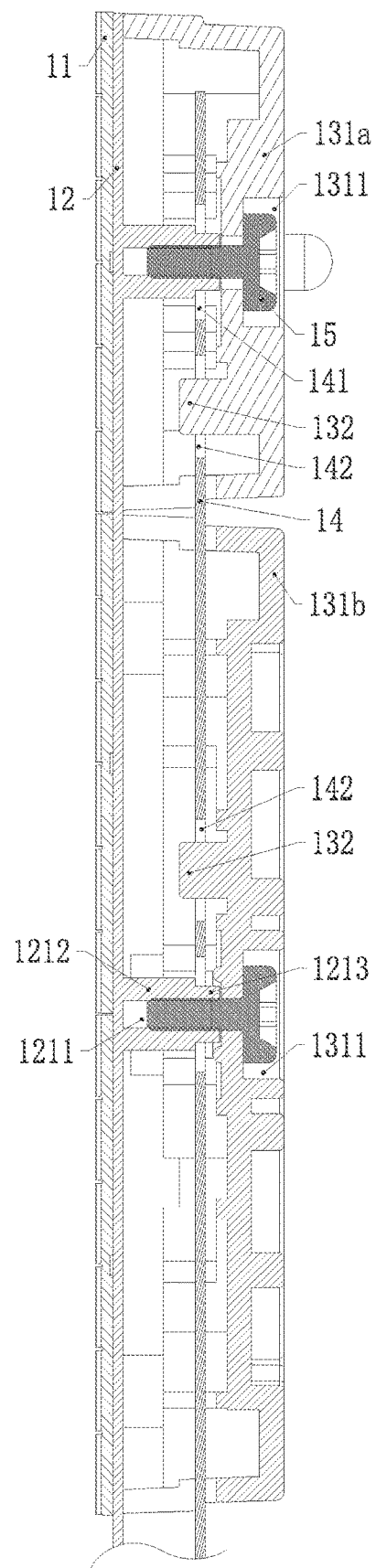
FIG. 5 is a sectional view (A-A) of the rear body unit A and rear body unit B in FIG. 3.
Figure 6:
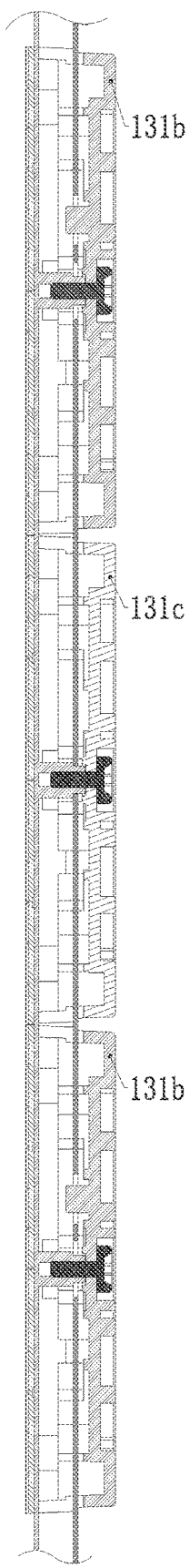
FIG. 6 is a sectional view (A-A) of the rear body unit B and rear body unit C in FIG. 3.

Specifically, as shown in FIGS. 4 to 6, the center of the positioning column 121 is provided with a first threaded hole 1211, and the fastener is a connection screw 15, the connection screw 15 passes through the positioning hole 1311 and is matched with the first threaded hole 1211 to fixedly connect the lamp panel 12 and the rear body 13. The connecting structure is simple, which is convenient for processing and maintenance.

Preferably, the positioning hole 1311 is a stepped hole, the threaded section of the connection screw 15 is matched with the small end of the stepped hole, and the head of the connection screw 15 is located in the stepped hole. In this way, the connection screw 15 is prevented from protruding from the rear body 13, which is easy to wear and cause looseness. Meanwhile, it can play a waterproof role.

Specifically, the outer surface of the positioning column 121 is provided with external threads, the fastener is a nut, the positioning column 121 passes through the positioning hole 1311 and is matched with the nut to fixedly connect the lamp panel 12 and the rear body 13. The connecting structure is simple, which is convenient for processing and maintenance.

Preferably, the positioning hole 1311 is a stepped hole, the threaded section of the positioning column 121 is matched with the small end of the stepped hole, and the nut is located in the stepped hole. In this way, the nut is prevented from protruding from the rear body 13, which is easy to wear and cause looseness. Meanwhile, it can play a waterproof role.

In an embodiment, as shown in FIGS. 4 to 6, the positioning column 121 is a cylinder, and the end close to the lamp panel 12 is a front end 1212, and the other end is a rear end 1213, the front end 1212 has a larger diameter than that of the rear end 1213.

The elastic stop piece 14 is provided with a plurality of first through holes 141 corresponding to the rear end 1213, and is sleeved on the rear end 1213 through the first through holes 141. Therefore, the elastic stop piece 14 is more firmly fixed.

Specifically, the length of the first through hole 141 is greater than the left-right length of the rear end 1213; when the LED display unit 1 is bent, the positioning column 121 slides along the first through hole 141; when the positioning column 121 moves to the leftmost or rightmost end of the first through hole 141, the positioning column 121 cannot continue to move to the left or right (at this point, the bending degree of the LED display unit 1 is the ultimate bending degree), so as to avoid excessive bending of the LED display unit 1.

Specifically, a plurality of positioning columns 121 are distributed in five rows, two elastic stop pieces 14 are provided, and the two elastic stop pieces 14 are respectively sleeved on the positioning columns 121 in the second row and the fourth row. In this way, the ultimate bending degree of the LED display unit 1 can be better limited.

In an embodiment, as shown in FIGS. 4 to 6, the elastic stop piece 14 is provided with a second through hole 142, and a stop block 132 of the rear body 13 is inserted into the second through hole 142. when the LED display unit 1 is bent, the stop block 132 slides along the second through hole 142, and when the stop block 132 abuts against the end of the second through hole 142 in the sliding direction of the positioning column 121, the positioning column 121 abuts against the end of the first through hole 141 in the sliding direction of the positioning column 121, or the positioning column 121 does not abut against the end of the first through hole 141 in the sliding direction of the positioning column 121. The impact force on the positioning column 121 during extreme bending of the LED display unit 1 is transferred to the stop block 132, so as to prevent the positioning column 121 from falling off.

Specifically, the center lines of the first through hole 141 and the second through hole 142 are located on the same straight line in the length direction, and the second through hole 142 is arranged close to the first through hole 141, thereby it is convenient for processing and maintenance.

In an embodiment, as shown in FIGS. 3, 4, 17 and 18, The plurality of rear body units 131 are divided into a rear body unit B 131*b*, a rear body unit A 131*a* for connecting with the box frame 3, and a rear body unit C 131*c* for fixedly connecting with the power control box 4. The rear body unit C 131*c* is located in the middle of the rear body 13, and the rear body unit B 131*b* is located between the rear body unit A 131*a* and the rear body unit C 131*c*.

The rear body unit C 131*c* is provided with a third through hole 1312, the lamp panel 12 is correspondingly provided with a connector 122 for connecting the power control box 4, and the connector 122 is inserted into the third through hole 1312. Thereby the box frame 3 is prevented from being tightly connected with the whole rear body 13, and the bend resistance of the LED display screen is reduced.

Specifically, the side of the rear body unit 131 connected with another rear body unit 131 is set as an inclined plane, and the inclined plane inclines from the end of the rear body unit 131 close to the lamp panel 12 to the end of the rear body unit 131 away from the lamp panel 12. Therefore, the gap between the rear body unit 131 is enlarged, which is beneficial to releasing the bending stress and preventing the rear body 13 from breaking during bending.

Figure 2:
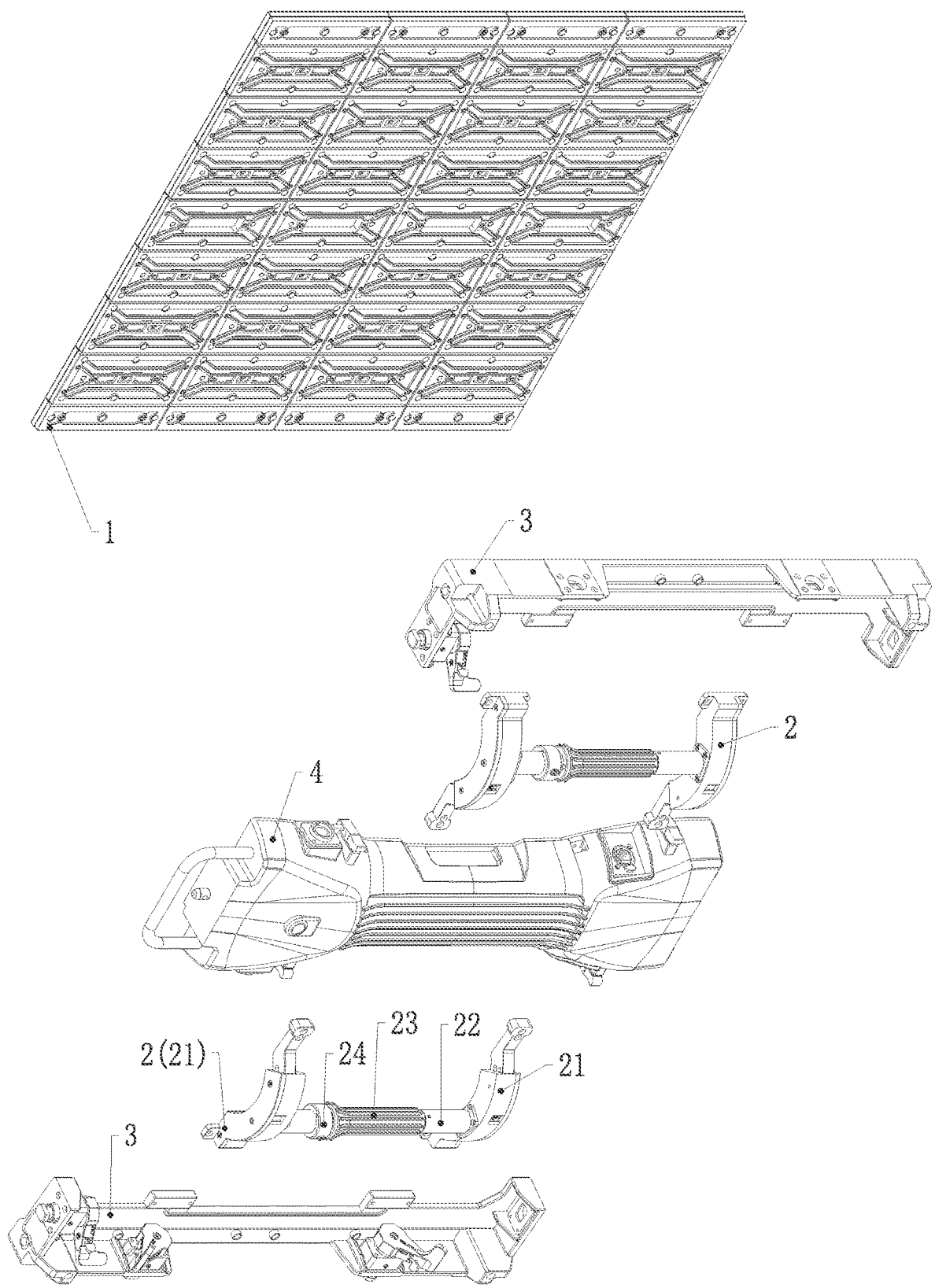
FIG. 2 is an exploded view of the structure in FIG. 1.
Figure 3:
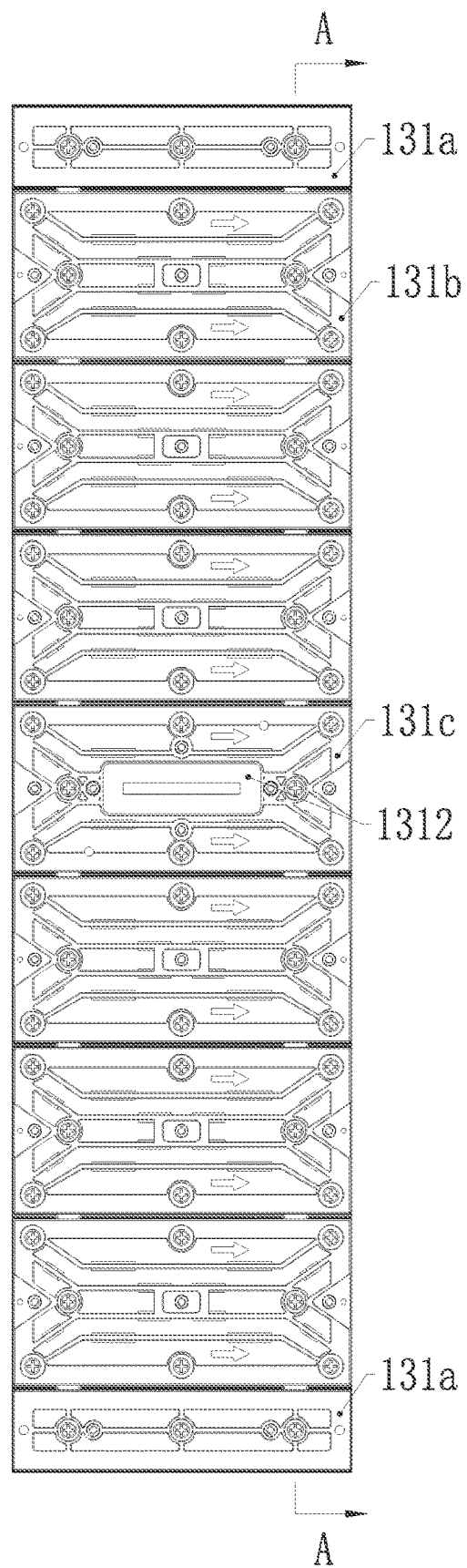
FIG. 3 is a structural schematic diagram of the LED display unit in FIG. 1.
Figure 7:
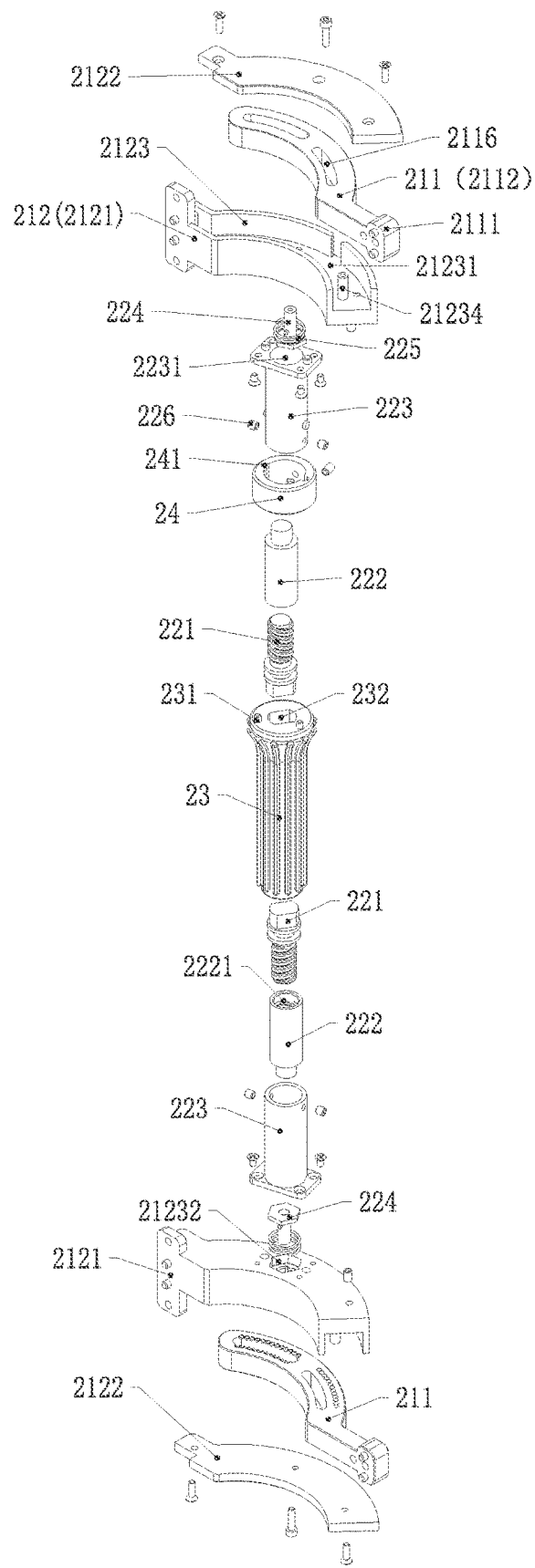
FIG. 7 is an exploded view of the structure of the curved surface adjustment device in FIG. 1.

In an embodiment, as shown in FIGS. 1, 2 and 7, the curved surface adjustment device 2 includes an angle rotating assembly 21 and a locking assembly, the angle rotating assembly 21 includes a middle plate 211 and a shell 212. The shell 212 includes a first mounting part 2121 and a containing part, in which an arc chute 21231 is formed, the middle plate 211 includes a second mounting part 2111 and an arc sliding part 2112. The second mounting part 2111 is located outside the arc chute 21231, the arc sliding part 2112 is located inside the arc chute 21231, the first mounting part 2121 and second mounting part 2111 are located on both sides of the arc chute 21231. The first mounting part 2121 is fixedly connected to the box frame 3, and the second mounting part 2111 is fixedly connected to the power control box 4.

The locking assembly includes a locking mechanism 22, the locking mechanism 22 has a locking state and an unlocking state, and when the locking mechanism 22 is in the locking state, the arc sliding part 2112 is locked in the arc chute 21231, when the locking mechanism 22 is in the unlocking state, the arc sliding part 2112 can slide relative to the arc chute 21231 to adjust the included angle between the first mounting part 2121 and the second mounting part 2111. The LED display screen adjusted by the curved surface adjustment device 2 has better surface smoothness and smaller radius, which can bring better display effect. Moreover, the curved surface adjustment device 2 has the characteristics of reliable structure, high stability and simple adjustment.

Figure 8:
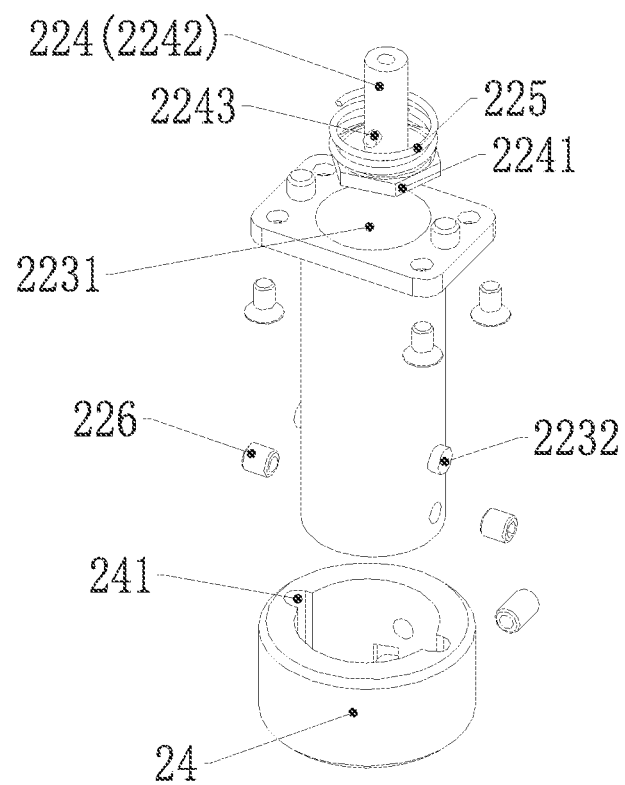
FIG. 8 is an exploded view of the structures of the locking piece, rotation stop ring, detent, shaft sleeve and spring in FIG. 7.

In an embodiment, as shown in FIGS. 7 and 8, the containing part includes a cover plate 2122 and a bottom plate 2123, the arc chute 21231 is arranged on the bottom plate 2123, and the cover plate 2122 is fixedly connected to the bottom plate 2123 and covers the arc chute 21231, so that the arc sliding part 2112 is located in the arc chute 21231, and the arc sliding part 2112 is prevented from falling off from the arc chute 21231.

Figure 9:
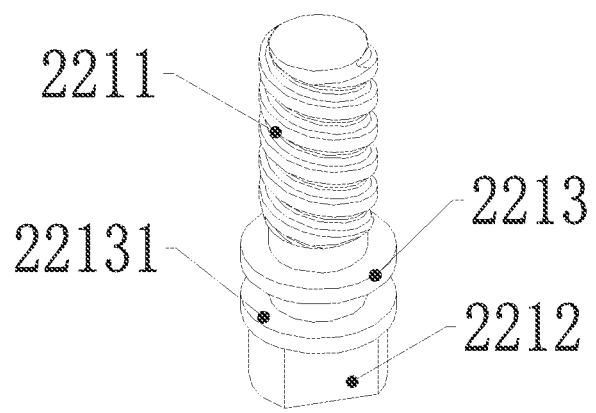
FIG. 9 is an exploded view of the structure of the threaded piece in FIG. 7.
Figure 10:
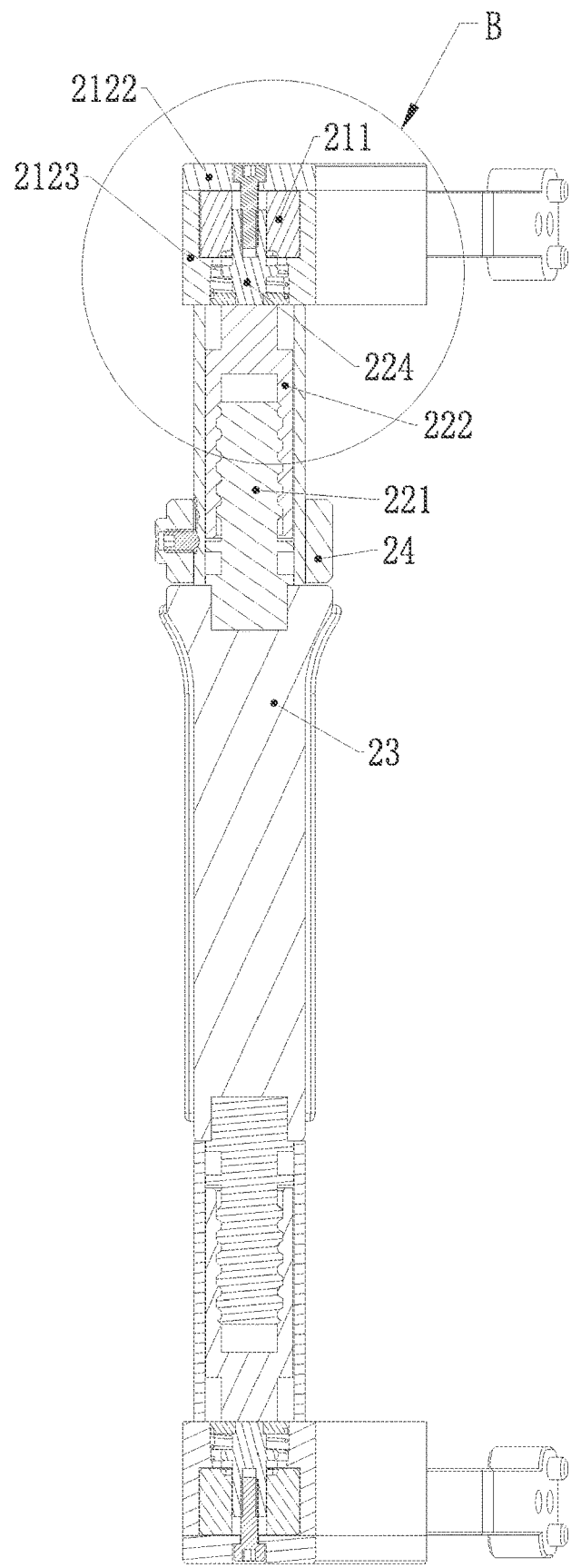
FIG. 10 is a sectional view of the locking mechanism of the curved surface adjustment device in FIG. 1 in the unlocking state.
Figure 11:
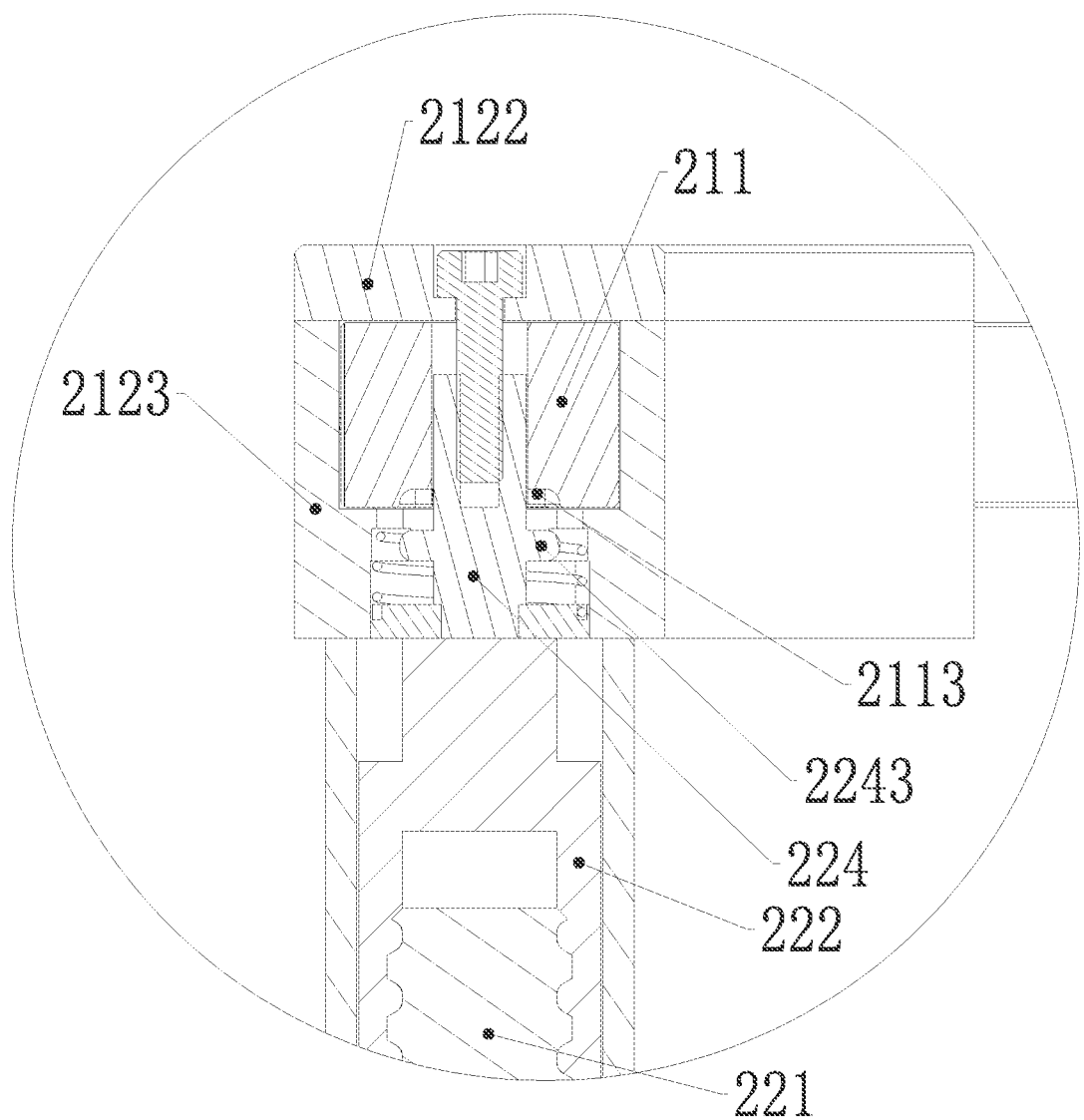
FIG. 11 is an enlarged view of the structure at b in FIG. 10.
Figure 12:
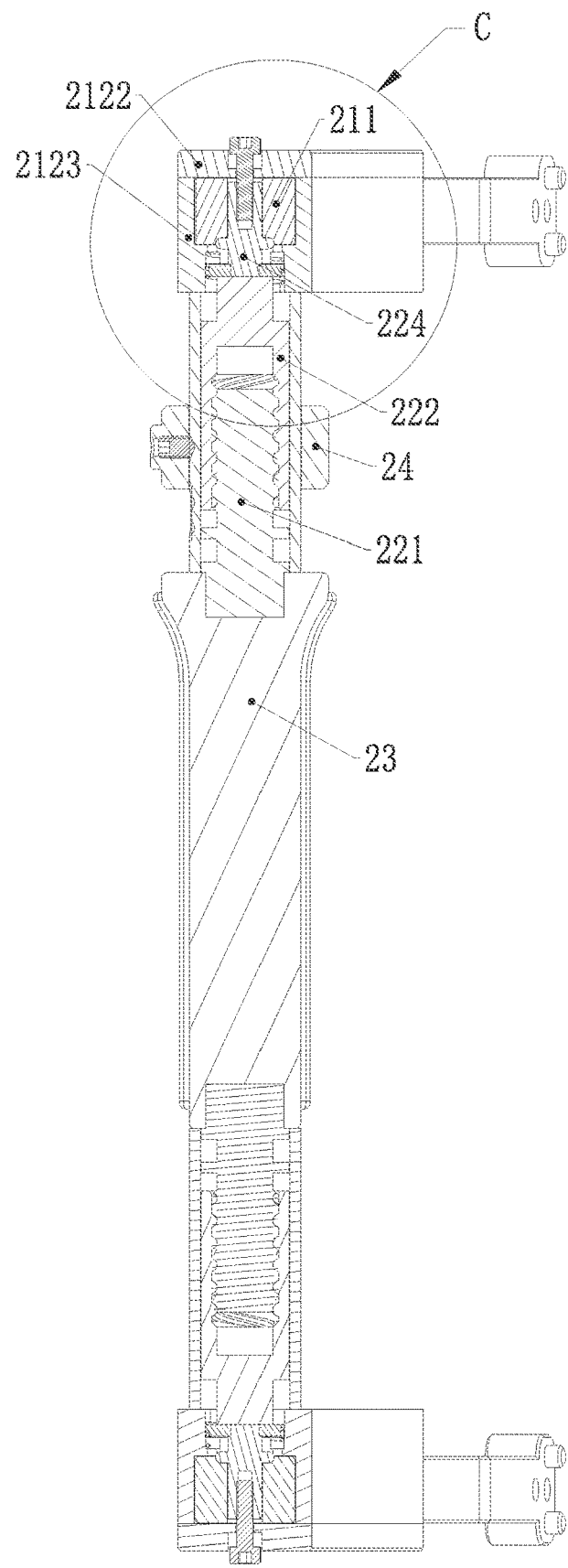
FIG. 12 is a sectional view of the locking mechanism of the curved surface adjustment device in FIG. 1 in the locking state.
Figure 13:
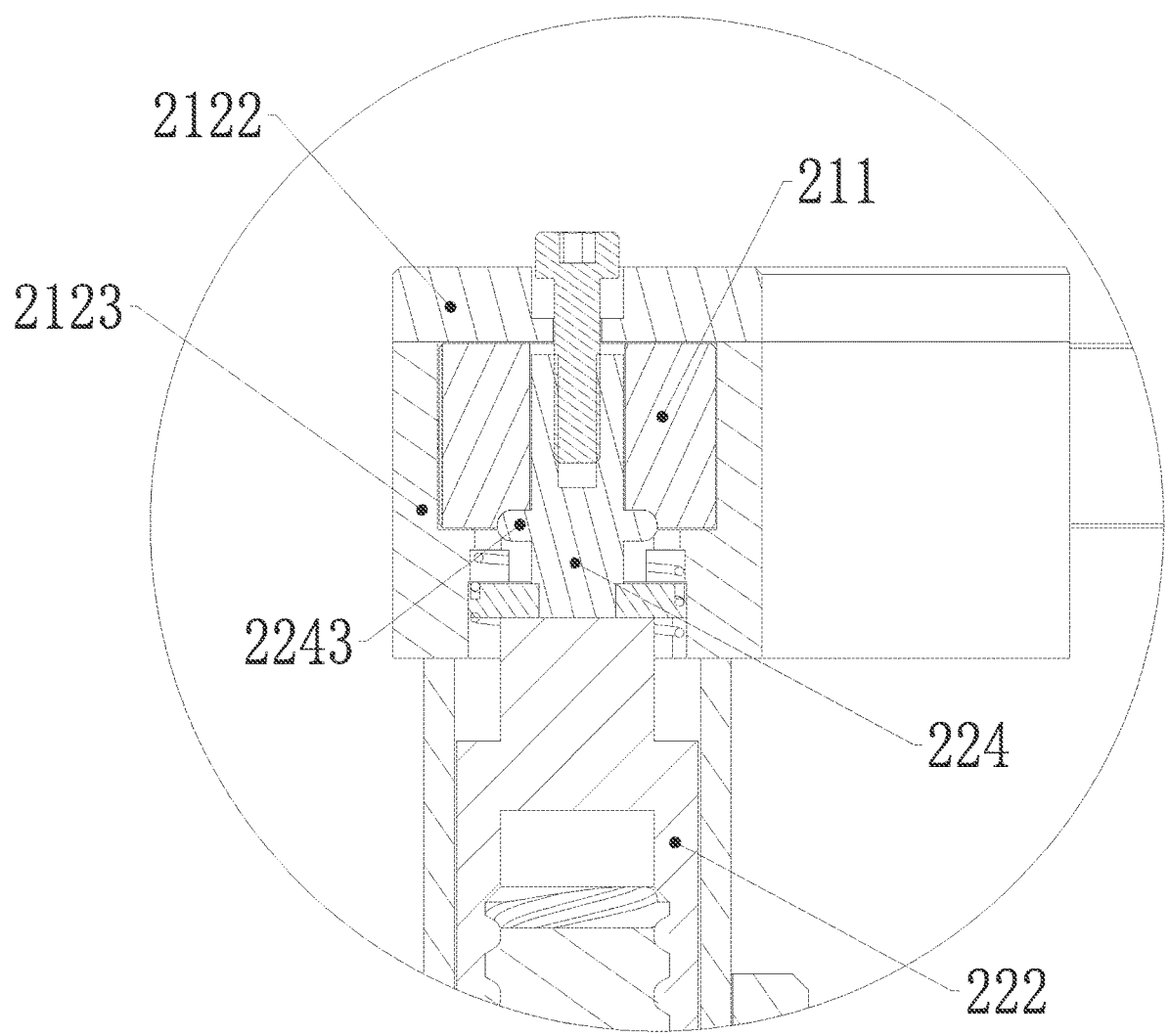
FIG. 13 is an enlarged view of the structure of C in FIG. 12.

In an embodiment, as shown in FIGS. 7-9, the locking mechanism 22 includes a threaded piece 221, a butt-up bar 222, a shaft sleeve 223 and a locking piece 224. The shaft sleeve 223 is fixedly connected to the bottom plate 2123, a fourth through hole 2231 extending along the axial direction of the shaft sleeve 223 is arranged on the shaft sleeve 223, a locking hole 21232 axially passing through the fourth through hole 2231 is arranged on the bottom plate 2123, and the locking piece 224 is located in the locking hole 21232.

The butt-up bar 222 is slidably connected in the fourth through hole 2231, one end of the butt-up bar 222 is provided with a second threaded hole 2221, and one end of the threaded piece 221 is threadedly connected in the second threaded hole 2221. When the other end of the butt-up bar 222 abuts against the locking piece 224, the butt-up bar 222 can slide along the fourth through hole 2231 by rotating the threaded piece 221, so that the locking piece 224 can lock the arc sliding part 2112, the arc sliding part 2112 is locked in the arc chute 21231, and the included angle between the first mounting part 2121 and the second mounting part 111 is relatively fixed.

Specifically, the outer side wall of the butt-up bar 222 is provided with an anti-rotation slot, the inner side wall of the shaft sleeve 223 is provided with an anti-rotation screw, and the anti-rotation slot is in sliding fit with the anti-rotation screw, so that the butt-up bar 222 can only slide along the fourth through hole 2231 of the shaft sleeve 223, but cannot rotate.

In an embodiment, as shown in FIGS. 8-16, the locking piece 224 includes a locking plate 2241 and a locking shaft 2242 fixed on the locking plate 2241, and a positioning pin 2243 is arranged on the locking shaft 2242. The middle plate 211 is provided with a plurality of locking slots 2113 which can limit the positioning pin 2243. When the threaded piece 221 is rotated, the butt-up bar 222 slides along the fourth through hole 2231, so that the positioning pin 2243 is locked in the corresponding locking slot 2113, thereby locking the arc sliding part 2112 in the arc chute 21231.

In an embodiment, as shown in FIGS. 7-9, the locking mechanism 22 further includes a spring 225, which is sleeved on the locking shaft 2242 and supported between the locking plate 2241 and the bottom plate 2123. When the locking mechanism 22 is in the locking state, the spring 225 is compressed between the locking plate 2241 and the bottom plate 2123. When the locking mechanism 22 is switched to the unlocking state, the elastic force of the spring 225 can provide a restoring force for the locking piece 224.

In an embodiment, as shown in FIGS. 7-9, the threaded piece 221 includes a threaded part 2211, a fixed part 2212, and a stop collar 2213 located between the threaded part 2211 and the fixed part 2212. The threaded part 2211 is screwed into the second threaded hole 2221 to realize the threaded connection between one end of the threaded piece 221 and the second threaded hole 2221.

As shown in FIG. 7, an annular rotation slot 22131 is formed on the outer periphery of the stop collar 2213, and the locking mechanism 22 further includes a detent 226, the detent 226 passes through the shaft sleeve 223 and is clamped into the rotation slot 22131, so that the threaded piece 221 can only be rotatably connected in the fourth through hole 2231 of the shaft sleeve 223.

As shown in FIG. 7, the locking assembly further includes a rotating rod 23, one end of the rotating rod 23 is fixedly connected with the fixed part 2212, and the threaded piece 221 can rotate in the fourth through hole 2231 of the shaft sleeve 223 by rotating the rotating rod 23.

Specifically, one end of the rotating rod 23 can be provided with a clamping hole 232 matching the shape of the fixed part 2212, and the fixed part 2212 is clamped in the clamping hole 232 to realize the fixed connection between one end of the rotating rod 23 and the fixed part 2212. The cross section of the fixed part 2212 is not circular.

In an embodiment, as shown in FIGS. 7-9, the locking assembly further includes a rotation stop ring 24 which is sleeved on the shaft sleeve 223, a rotation stop slot 241 is arranged on the inner side wall of the rotation stop ring 24, and a rotation stop hole is arranged at one end of the rotation stop ring 24;

A first rotation stop block 2232 is arranged on the shaft sleeve 223, and the first rotation stop block 2232 is slidably connected in the rotation stop slot 241, one end of the rotating rod 23 corresponding to the position of the rotation stop hole is provided with a second rotation stop block 231.

The rotation stop ring 24 is provided with a rotation stop position and a rotation position. At the rotation stop position of the rotation stop ring 24, the second rotation stop block 231 is located in the rotation stop hole to limit the relative rotation between the threaded piece 221 and shaft sleeve 223. At the rotation position of the rotation stop ring 24, the second rotation stop block 231 is away from the rotation stop hole, so that threaded piece 221 can rotate relative to the shaft sleeve 223.

In an embodiment, as shown in FIGS. 1, 2, 7, 17 and 18, the curved surface adjustment device 2 includes two angle rotating assemblies 21, and the locking assembly includes two locking mechanisms 22. The two angle rotating assemblies 21 are symmetrically arranged at both ends of the rotating rod 23, and the two locking mechanisms 22 are symmetrically connected to both ends of the rotating rod 23 and respectively located between the angle rotating assembly 21 and the rotating rod 23. Rotating the rotating rod 23 can make the two locking mechanisms 22 switch between the locking state and the unlocking state synchronously.

By controlling the rotating rod 23 located in the middle of the curved surface adjustment device 2, the two locking mechanism 22 located at both ends of the rotating rod 23 can simultaneously switch from the locking state to the unlocking state, or simultaneously switch from the unlocking state to the locking state, so as to simultaneously lock or unlock the arc sliding parts 2112 of the two angle rotating assemblies 21.

The first mounting parts 2121 of two angle rotating assemblies 21 are fixedly connected to the box frame 3 in parallel, and the second mounting parts 2111 of the two angle rotating assemblies 21 are fixedly connected to the power control box 4 in parallel, so that the curved surface adjustment device 2 can adjust both ends of the LED module at the same time, thereby the curved surface of the LED display screen is smoother.

Figure 14:
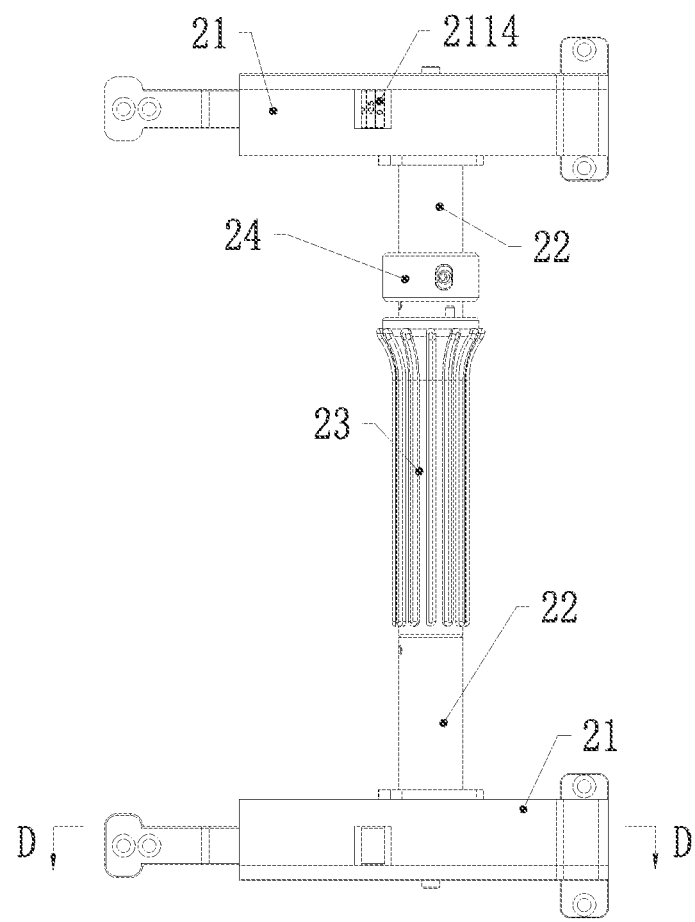
FIG. 14 is a front view of the curved surface adjustment device in FIG. 1.
Figure 15:
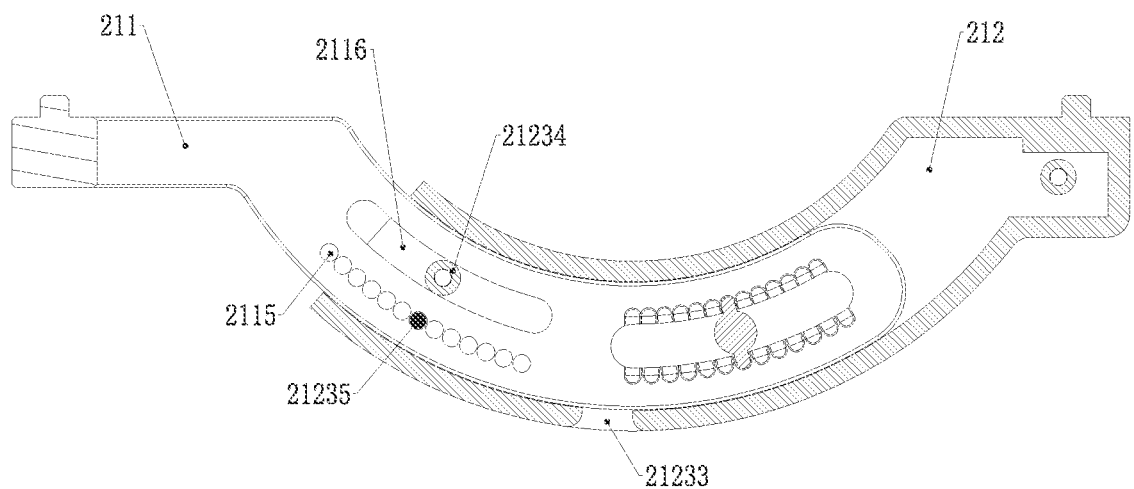
FIG. 15 is a sectional view of D-D in FIG. 14.
Figure 16:
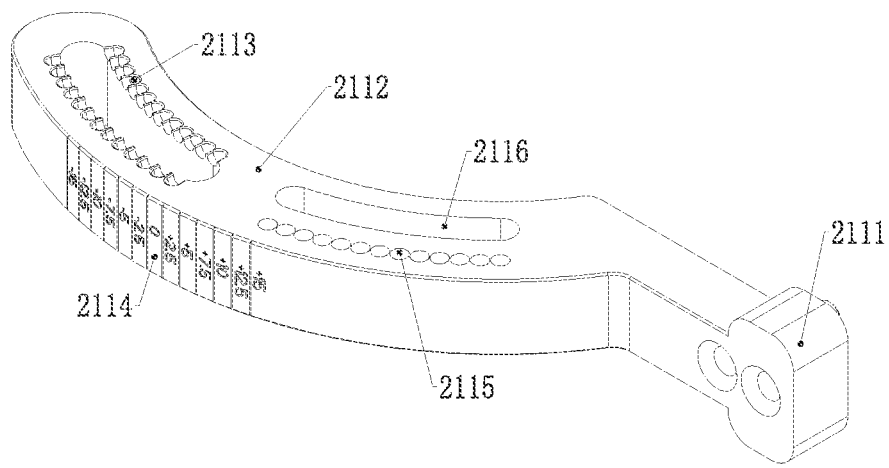
FIG. 16 is a structural schematic diagram of the middle plate in FIG. 15.
Figure 17:
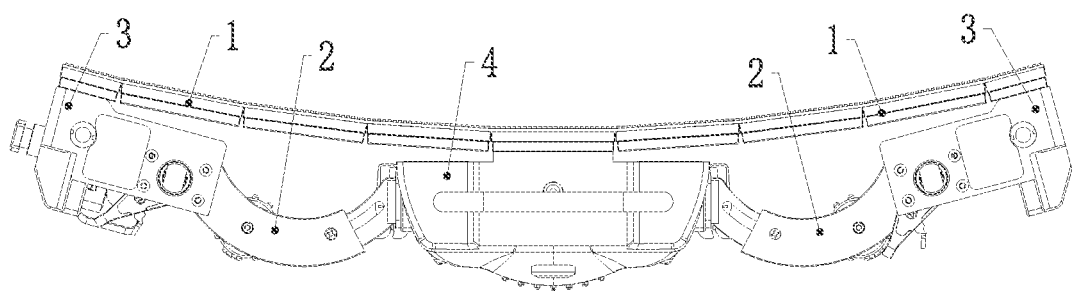
FIG. 17 is a use state diagram of the LED display unit in FIG. 1 when it is bent inward into an arc shape.
Figure 18:
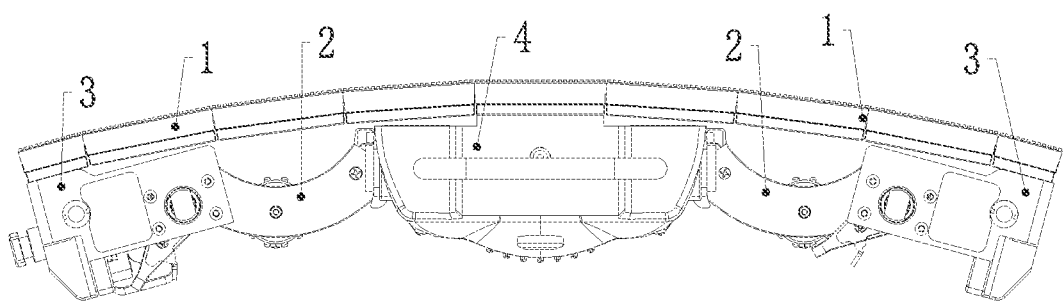
FIG. 18 is a use state diagram of the LED display unit in FIG. 1 when it is bent outward into an arc shape.

In an embodiment, as shown in FIGS. 14-16, the arc sliding part 2112 of the middle plate 211 is provided with an angle label 2114 and a marble slot 2115, and the position on the bottom plate 2123 corresponding to the angle label 2114 is provided with a label hole 21233. A marble screw 21235 is arranged on the position of the bottom plate 2123 corresponding to the marble slot 2115. Preferably, the middle of several marble slots 2115 is selected as the position of marble screw 21235, which is the initial angle and the scale is 0.

The angle label 2114 makes it easy to intuitively adjust the angle and limit. Preferably, the included angle between two adjacent labelled scales of the angle label 2114 is the same as the included angle between two adjacent locking slots 2113. In the embodiment shown in FIGS. 9-11, the included angle between two adjacent locking slots 2113 is 2.5°. And the angle between two adjacent labelled scales of the angle label 2114 is also 2.5°. Specifically, there are 13 labelled scales on the angle label 2114: −15°, −12.5°, −10°, −7.5°, −5°, −2.5°, 0°, 2.5°, 5°, 7.5°, 10°, 12.5° and 15°. It can be understood that when the positioning pin 2243 moves one locking slot 2113, the angle between the middle plate 211 and the shell 212 can be adjusted to 2.5°, that is, the adjustment angle of the curved surface of LED display screen is 2.5°. The angle label 2114 can clearly tell the user the adjustment angle of LED display screen.

In other embodiments, the included angle between two adjacent locking slots 2113 can be customized according to user requirements.

The marble slot 2115 is located on the side of middle plate 211 where the locking slot 2113 is set, and the marble screw 21235 is located in the marble slot 2115. An extrudable elastic structure is adopted for the marble screw 21235 to improve the hand feeling, reach initial adjustment angle, and then complete locking by the locking mechanism 22.

In an embodiment, as shown in FIGS. 14-16, a guide arc hole 2116 is arranged on the middle plate 211 and a guide column 21234 is arranged on the bottom plate 2123, radians of the guide arc hole 2116 and the arc chute 21231 are the same and their centers coincide, and the guide column 21234 is positioned in the guide arc hole 2116.

The guide column 21234 cooperates with the guide arc hole 2116, thus providing a guide for the arc sliding part 2112 of the middle plate 211 to slide in the arc chute 21231 of the bottom plate 2123.

In an embodiment, as shown in FIGS. 1, 2, 17 and 18, the LED display screen includes two sets of the curved surface adjustment devices 2, and the box frame 3 includes a left frame and a right frame. The first mounting part 2121 of one set of the curved surface adjustment device 2 is fixedly connected to the left frame, and the second mounting part 2111 is fixedly connected to the power control box 4. The first mounting part 2121 of another set of the curved surface adjustment device 2 is fixedly connected to the right frame, and the second mounting part 2111 is fixedly connected to the power control box 4; The radians of curved surfaces on both sides of the LED display unit 1 can be adjusted by the curved surface adjustment devices 2 on both sides of the power control box 4, so as to increase the stress points for adjusting the radians and reduce the possibility of damage of the LED display unit 1 caused by excessive stress when adjusting the curved surface.

Specifically, the left frame and the right frame are symmetrically and fixedly connected to the two sides of the power control box 4, and two curved surface adjustment devices 2 are symmetrically arranged on the two sides of the power control box 4.

Preferably, there may be one curved surface adjustment device 2 for each of the two sets, which is simple in structure and convenient for adjustment. Also, there may be a plurality of curved surface adjustment devices in each set.

The above are only preferred embodiments of the present disclosure, and not intended to limit the disclosure. Any modifications, equivalent substitution and improvement made within the spirit and principle of the disclosure shall be included in the protection scope of the present disclosure.

What is claimed is:

1. An LED display screen, comprising an LED display unit, a box frame arranged at two outer ends of the LED display unit and a power control box fixedly connected to the LED display unit, characterized by comprising a front body, a rear body, a bendable flexible lamp panel and an elastic stop piece for limiting the ultimate bending degree of the lamp panel; the front body covers one side of the lamp panel provided with LED lamps, and the rear body comprises a plurality of rear body units, each rear body unit is fixedly connected to one side of the lamp panel facing away from the LED lamps, and adjacent rear body units are arranged at intervals; the elastic stop piece is positioned between the lamp panel and the rear body; and the LED display screen further comprises a curved surface adjustment device for adjusting the curved shape of the LED display unit, wherein one end of the curved surface adjustment device is fixedly connected to the box frame and another end is fixedly connected to the power control box.

2. The LED display screen of claim 1, wherein a positioning column is arranged on one side of the lamp panel away from the LED lamps, and a positioning hole is correspondingly arranged on the rear body unit; a connection screw passes through the positioning hole and matches with a first threaded hole of the positioning column to fixedly connect the lamp panel and the rear body.

3. The LED display screen of claim 2, wherein the positioning column is a cylinder, and one end close to the lamp panel is a front end, another end is a rear end; the front end has a larger diameter than the rear end; and the elastic stop piece is provided with a plurality of first through holes corresponding to the rear end, and the elastic stop piece is sleeved on the rear end through the first through holes; and when the LED display unit is bent, the positioning column slides along the first through hole.

4. The LED display screen of claim 3, wherein the elastic stop piece is provided with a second through hole, and a stop block of the rear body is inserted into the second through hole; when the LED display unit is bent, the stop block slides along the second through hole, and when the stop block abuts against an end of the second through hole in the sliding direction of the positioning column, either the positioning column abuts against an end of the first through hole in the sliding direction of the positioning column or the positioning column does not abut against an end of the first through hole in the sliding direction of the positioning column.

5. The LED display screen of claim 1, wherein the plurality of rear body units are divided into a rear body unit B, a rear body unit A for connecting with the box frame and a rear body unit C for fixedly connecting with the power control box, the rear body unit C is positioned in the middle of the rear body, and the rear body unit B is positioned between the rear body unit A and the rear body unit C; and the rear body unit C is provided with a third through hole, the lamp panel is correspondingly provided with a connector for connecting the power control box, and the connector is inserted into the third through hole.

6. The LED display screen of claim 1, wherein the curved surface adjustment device comprises an angle rotating assembly and a locking assembly, and the angle rotating assembly comprises a middle plate and a shell, the shell comprises a first mounting part and a containing part, and an arc chute is formed inside the containing part, the middle plate comprises a second mounting part and an arc sliding part, the second mounting part is positioned outside the arc chute, the arc sliding part is positioned inside the arc chute, the first mounting part and the second mounting part are positioned at both sides of the arc chute; the first mounting part is fixedly connected to the box frame, and the second mounting part is fixedly connected to the power control box; and the locking assembly comprises a locking mechanism, and the locking mechanism has a locking state and an unlocking state, when the locking mechanism is in the locking state, the arc sliding part is locked in the arc chute, when the locking mechanism is in the unlocking state, the arc sliding part can slide relative to the arc chute to adjust the included angle between the first mounting part and the second mounting part.

7. The LED display screen of claim 6, wherein the containing part comprises a cover plate and a bottom plate, the arc chute is arranged on the bottom plate, and the cover plate is fixedly connected to the bottom plate and covers the arc chute.

8. The LED display screen of claim 7, wherein the locking mechanism comprises a threaded piece, a butt-up bar, a shaft sleeve and a locking piece, and the shaft sleeve is fixedly connected to the bottom plate; a fourth through hole extending along the axial direction of the shaft sleeve is arranged on the shaft sleeve, a locking hole axially passing through the fourth through hole is arranged on the bottom plate, and the locking piece is positioned in the locking hole; and the butt-up bar is slidably connected in the fourth through hole, one end of the butt-up bar is provided with a second threaded hole, one end of the threaded piece is threadedly connected in the second threaded hole, another end of the butt-up bar abuts against the locking piece, and rotating the threaded piece can make the butt-up bar slide along the fourth through hole, so that the locking piece locks the arc sliding part.

9. The LED display screen of claim 8, wherein the locking piece comprises a locking plate and a locking shaft fixed on the locking plate, and a positioning pin is arranged on the locking shaft, the middle plate is provided with a plurality of locking slots for limiting the positioning pin, and rotating the threaded piece can lock the positioning pin in the corresponding locking slots.

10. The LED display screen of claim 9, wherein the locking mechanism further comprises a spring, the spring is sleeved on the locking shaft and supported between the locking plate and the bottom plate.

11. The LED display screen of claim 8, wherein the threaded piece comprises a threaded part, a fixed part and a stop collar located between the threaded part and the fixed part, and the threaded part is threadedly connected in the second threaded hole;

an annular rotation slot is formed on the periphery of the stop collar, and the locking mechanism further comprises a detent, the detent passes through the shaft sleeve and is clamped into the rotation slot; and the locking assembly further comprises a rotating rod, one end of the rotating rod is fixedly connected with the fixed part, and the threaded piece can be rotated by rotating the rotating rod.

12. The LED display screen of claim 11, wherein the locking assembly further comprises a rotation stop ring, the rotation stop ring is sleeved on the shaft sleeve, a rotation stop slot is arranged on an inner side wall of the rotation stop ring, and a rotation stop hole is arranged at one end of the rotation stop ring;

a first rotation stop block is arranged on the shaft sleeve, the first rotation stop block is slidably connected in the rotation stop slot, and a second rotation stop block is arranged at one end of the rotating rod corresponding to the position of the rotation stop hole; and the rotation stop ring is provided with a rotation stop position and a rotation position, and at the rotation stop position of the rotation stop ring, the second rotation stop block is located in the rotation stop hole; at the rotation position of the rotation stop ring, the second rotation stop block is away from the rotation stop hole.

13. The LED display screen of claim 12, wherein the curved surface adjustment device comprises two angle rotating assemblies, and the locking assembly comprises two locking mechanisms, the two angle rotating assemblies are symmetrically arranged at two ends of the rotating rod, the two locking mechanisms are symmetrically connected at two ends of the rotating rod and are respectively positioned between the angle rotating assembly and the rotating rod; rotating the rotating rod can make the two locking mechanisms switch between the locking state and the unlocking state synchronously.

14. The LED display screen of claim 7, wherein a guide arc hole is arranged on the middle plate, a guide column is arranged on the bottom plate, radians of the guide arc hole and the arc chute are the same and their centers coincide, and the guide column is positioned in the guide arc hole.

15. The LED display screen of claim 14, wherein the LED display screen comprises two sets of the curved surface adjustment devices, the box frame comprises a left frame and a right frame, the first mounting part of one set of the curved surface adjustment device is fixedly connected to the left frame, and the second mounting part is fixedly connected to the power control box; the first mounting part of another set of the curved surface adjustment device is fixedly connected to the right frame, and the second mounting part is fixedly connected to the power control box.

* * * * *